United States Patent

Rohner

[11] Patent Number: 5,948,219
[45] Date of Patent: Sep. 7, 1999

[54] APPARATUS FOR SELECTIVELY EXPOSING A SEMICONDUCTOR TOPOGRAPHY TO AN ELECTRIC FIELD

[75] Inventor: Don R. Rohner, Austin, Tex.

[73] Assignee: Advanced Micro Devices, Inc.

[21] Appl. No.: 08/852,691

[22] Filed: May 7, 1997

[51] Int. Cl.[6] ........................................................ C25F 7/00
[52] U.S. Cl. ................................ 204/224 R; 204/224 M; 204/225
[58] Field of Search .............................. 204/224 M, 225, 204/224 R; 205/652, 656, 687

[56] References Cited

U.S. PATENT DOCUMENTS

| | | | |
|---|---|---|---|
| 4,110,190 | 8/1978 | Visser | 204/224 M |
| 5,160,590 | 11/1992 | Totsuka et al. | 205/652 X |
| 5,217,586 | 6/1993 | Datta et al. | 204/224 M X |

*Primary Examiner*—Donald R. Valentine
*Attorney, Agent, or Firm*—Kevin L. Daffer; Conley, Rose & Tayon

[57] ABSTRACT

A lithographic apparatus and method are presented which use an electric field to form features from a desired material upon an upper topography of a semiconductor substrate. A layer of an electric field resist material is formed over a layer of the desired material upon the upper topography of the semiconductor substrate. The electric field resist layer is then patterned by exposure to an electric field via the apparatus. The apparatus includes a plate and a voltage source. In one embodiment, the plate is electrically conductive and a lower surface of the plate has one or more raised portions with recessed portions existing between adjacent raised portions. The lower surface of the conductive plate is positioned above and in close proximity to the exposed surface of the electric field resist layer. The voltage source applies an electrical voltage between the electrically conductive plate and the semiconductor substrate, creating the electric field. The strength of the electric field between raised portions of the conductive plate and the semiconductor substrate is great enough to: (i) cause polymerized molecules within the electric field resist layer to break apart (positive resist layer), or (ii) cause unpolymerized molecules within the electric field resist layer to polymerize (negative resist layer). Following the exposing step, the unpolymerized electric field resist material is removed, followed by a portion of the layer of the desired material not covered by the remaining polymerized portion of the electric field material and the remaining polymerized portion of the electric field material.

17 Claims, 5 Drawing Sheets

APPARATUS FOR SELECTIVELY EXPOSING A SEMICONDUCTOR TOPOGRAPHY TO AN ELECTRIC FIELD

BACKGROUND OF THE INVENTION

1. Field of the Invention

This invention relates to integrated circuit manufacturing and more particularly to the patterning of layers of materials formed upon surfaces of semiconductor substrates.

2. Description of the Relevant Art

Integrated circuit features are typically patterned from a layer of a desired material formed upon a surface of a semiconductor substrate by removing unwanted portions of the layer. This process is called patterning, and is typically carried out using a process called photolithography. In photolithography, a layer of a light-sensitive material is first deposited on the surface of a layer to be patterned. The light-sensitive material undergoes a physical or chemical change when exposed to light. Such light-sensitive materials function as etch barriers, and are called resist etch barriers or simply "resists". Molecules of a "positive" resist material chemically join together (i.e., polymerize) in the absence of light. Exposing a portion of a positive resist layer to light causes the molecules therein to break apart, converting the exposed portion to a more soluble state. Molecules of a "negative" resist material, on the other hand, polymerize only when exposed to light. Select portions of the resist layer are exposed to light passed through a pattern (i.e., a mask). The polymerized portions of the resist layer are able to resist an etchant during a subsequent etching step.

Following exposure, the resist layer is subjected to a chemical which dissolves the unpolymerized portions during a "developing" step. The developing step forms voids in the resist layer. The remaining portion of the resist layer protects the underlying portion of the layer to be patterned during the subsequent etching step. During the etching step, the portion of the layer to be patterned not covered by the remaining portion of the resist layer is chemically removed by an etchant. Following the etching step, the remaining portion of the resist layer is removed, leaving the desired features on the surface of the semiconductor substrate.

The limit to the smallest physical dimension of a feature which may be formed using photolithography is dependent upon the wavelength of light used. Shorter wavelengths allow the formations of features having smaller physical dimensions. Most photolithography is currently performed using ultraviolet light having wavelengths between 350 and 450 nanometers (nm). The trend in photolithography is toward shorter and shorter wavelengths of light.

Several alternate lithography techniques offer the ability to form features having physical dimensions smaller than those obtainable using photolithography, including x-ray lithography, electron beam lithography, and ion beam lithography. Like photolithography, all three of these alternative lithography techniques use energy to transfer a pattern to a resist layer. X-ray lithography uses x-rays of very short wavelength (e.g., 40–500 nm) to transfer a pattern to a layer of a material having a high sensitivity to x-rays (i.e., an x-ray resist layer). Electron beam lithography uses electrons, having wave-like properties, at energy levels equating to wavelengths between 2 and 5 nm. The electrons are formed into a beam, and the beam is scanned across the surface of a layer of a material which undergoes chemical or physical changes upon exposure to the electron beam (i.e., an electron beam resist layer). In ion beam lithography, ions (i.e., charged atoms) are used to transfer a pattern to a layer of a material having a high sensitivity to ions (i.e., an ion beam resist layer). The above alternative lithography techniques have not yet matured, however, and are currently slow and expensive when compared to photolithography.

It would be beneficial to have a lithography process capable of forming features having physical dimensions smaller than those obtainable using photolithography and at least comparable to photolithography in terms of speed and cost. Such a lithography process would represent an advancement in wafer fabrication technology.

SUMMARY OF THE INVENTION

The problems outlined above are in large part solved by a lithographic apparatus and method which uses an electric field to form features from a desired material upon an upper topography of a semiconductor substrate. A layer of the desired material is first formed upon the upper topography of the semiconductor substrate. A layer of an electric field resist material is formed over the layer of the desired material. The electric field resist layer is then patterned by exposure to an electric field via the present apparatus. Exposure to the electric field causes molecules within portions of the electric field resist layer to chemically join together (i.e., polymerize), while molecules within the remainder of the electric field resist layer are not affected (i.e., remain unpolymerized). The polymerized portions of the electric field resist layer protect underlying portions of the layer of the desired material during a subsequent etch process.

Several different embodiments of the apparatus of the present invention include a plate and a voltage source. In one embodiment, the plate is electrically conductive, and is preferably made of a metal (e.g., aluminum). The electrically conductive plate has opposed upper and lower surfaces, the lower surface having one or more outward-extending (i.e., "raised") portions. A recessed portion exists between each pair of adjacent raised portions. During use, the lower surface of the conductive plate is positioned above and in close proximity to the exposed surface of the electric field resist layer. The voltage source is used to applying an electrical voltage between the electrically conductive plate and the semiconductor substrate. The electrical voltage may be a direct current (d.c.) voltage or an alternating current (a.c.) voltage. Application of the electrical voltage generates an electric field between the conductive plate and the semiconductor substrate. As the strength of an electric field between two parallel conductive plates is inversely proportional to the distance between the plates, the electric field is strongest between the raised portions of the conductive plate and the semiconductor substrate and weakest between the recessed portions of the conductive plate and the semiconductor substrate. The strength of the electric field between raised portions of the conductive plate and the semiconductor substrate is great enough to: (i) cause polymerized molecules within the electric field resist layer to break apart (positive resist layer), or (ii) cause unpolymerized molecules within the electric field resist layer to polymerize (negative resist layer).

In another embodiment, the voltage source is used to apply an electrical voltage between the electrically conductive plate and a second electrically conductive plate in electrical contact with a backside surface of the semiconductor substrate. The second electrically conductive plate may be, for example, an electrically conductive wafer chuck. In yet another embodiment, the plate includes multiple electrically conductive structures arranged upon the lower surface. The electrically conductive structures are electrically isolated from each other and from the plate. Each electrically conductive structure may be connected to a terminal of the voltage source through, for example, an electrical switch. The dimensions of each electrically conductive structure are preferably small compared to the dimensions of the smallest area to be exposed (i.e., feature to be formed). By using multiple exposures, shifting the lateral position of the plate relative to an underlying semiconductor substrate between each exposure, and selectively enabling different electrically conductive structures during each exposure, the plate may be used to transfer a complex pattern to an electric field resist layer.

The electric field is presumed to remain only in the regions of interest. That is, the stronger electric field between the raised portion and a localized region of the semiconductor substrate remains proximate only to the localized region. It is postulated the stronger electric field does not extend into the areas of weaker electric field to enhance those weaker fields. Thus, a clear demarcation exists at the juncture between the stronger and weaker electric field. This demarcation translates to the electric field resist material residing on the semiconductor substrate.

Following the exposing step, one or more post-exposure steps are carried out to remove unpolymerized electric field resist material and possibly to harden the remaining polymerized electric field resist material. The unpolymerized electric field resist material is removed during a developing step. Following any polymerized resist hardening steps, a portion of the layer of the desired material not covered by the remaining polymerized portion of the electric field material is removed during an etching step. The remaining polymerized portion of the electric field resist material is then removed during a resist strip step, leaving features formed form the desired material upon the upper topography of the semiconductor substrate. The resist strip material is any wet or dry etch composition suitably chosen to selectively remove the polymerized electric field resist material without adversely affecting the underlying surface.

BRIEF DESCRIPTION OF THE DRAWINGS

Other objects and advantages of the invention will become apparent upon reading the following detailed description and upon reference to the accompanying drawings in which:

FIG. 10b is a side elevation view of the plate of FIG. 10a;

Figure 1:
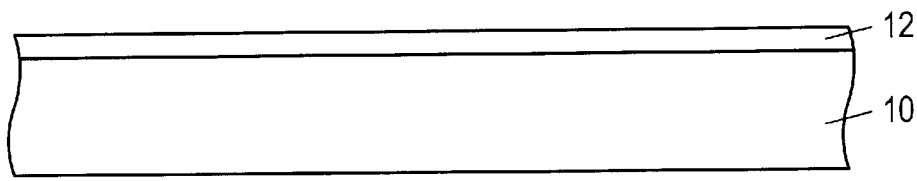
FIG. 1 is a partial cross-sectional view of a semiconductor substrate having a layer of a desired material formed upon an upper topography thereof, wherein the layer of the desired material is to be patterned to form features upon the upper topography.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

FIGS. 1–11d will be used to describe the lithographic apparatus and method of the present invention. FIG. 1 is a partial cross-sectional view of a semiconductor substrate 10 having a layer 12 of a desired material formed upon an upper topography thereof. Layer 12 is to be patterned to form features upon the upper topography. Layer 12 may be, for example, a silicon dioxide (i.e., oxide) layer grown via thermal oxidation or deposited using chemical vapor deposition (CVD), a polycrystalline silicon (i.e., polysilicon) layer deposited using CVD, a silicon nitride layer deposited using CVD, or a metal layer (e.g., aluminum) formed using sputtering.

Figure 2:
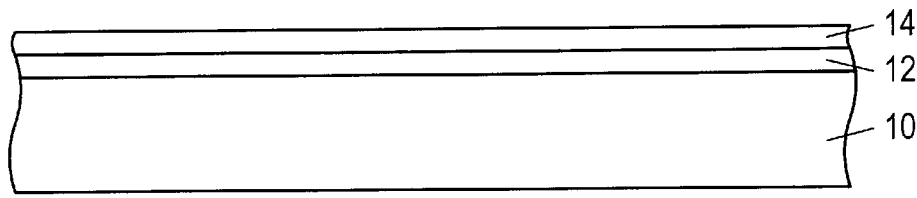
FIG. 2 is a partial cross-sectional view of the semiconductor substrate of FIG. 1 having an electric field resist layer formed over the layer to be patterned, wherein the electric field resist layer includes a substance which undergoes a chemical or physical change upon exposure to an electric field.

In order to pattern layer 12, an electric field resist etch barrier (i.e., electric field resist layer) is first formed over layer 12 and patterned. FIG. 2 is a partial cross-sectional view of semiconductor substrate 10 having an electric field resist layer 14 formed over layer 12. Electric field resist layer 14 includes a substance which undergoes a chemical or physical change upon exposure to an electric field. For example, molecules within electric field resist layer 14 may chemically join together (i.e., polymerize) in the absence of an electric field. Exposure of portions of electric field resist layer 14 to an electric field of sufficient strength may cause the molecules therein to break apart, converting the exposed portion to a more soluble state. In this case, electric field resist layer 14 is viewed as a positive resist layer. Alternately, molecules within electric field resist layer 14 may polymerize only when exposed to an electric field of sufficient strength. In this case, electric field resist layer 14 is viewed as a negative resist layer.

The electric field resist layer contemplates any material responsive to an electric field. Such material may exist in nature or be synthetically derived. Application of such material as described herein is what is deemed significant. An artisan skilled to subtractive electroplating and/or screen printing, for example, would appreciate such materials, however, not within the present scheme. Further, sophisticated polymers, polyamides or polyimides may be used for the herein stated purpose. Essentially any material which becomes selectively more difficult to remove (or more readily removed) as a result of its exposure to electric field falls within the present scope. It is believed that a modified electron beam (e-beam) resist material may be a suitable electric field resist material.

The material used to form electric field resist layer 14 is preferably a viscous fluid, or solid particles suspended in a viscous fluid, at room temperature. In this case, the electric field resist material is preferably applied using a spin-coat process. In the spin-coat process, semiconductor substrate 10 is typically held on a vacuum chuck. A sufficient amount of the liquid electric field resist material is then deposited near the center of the substantially flat upper surface of layer 12. The electric field resist material is then allowed to spread out into a puddle. When the puddle reaches a predetermined diameter, semiconductor substrate 10 and the vacuum chuck are sent into a rotating motion about an axis near the center of and normal to the upper surface of layer 12. Semiconductor substrate 10 and the vacuum chuck are rapidly accelerated to a predetermined rotational speed. Centrifugal forces spread the electric field resist material from the center of layer 12 to the outer edge of semiconductor substrate 10. Excess electric field resist material is thrown off of the outer edge of semiconductor substrate 10. A substantially even flow of electric field resist material is thus achieved across the upper surface of layer 12. Alternately, the electric field resist material may be applied to layer 12 using a roller evenly coated with the electric field resist material.

The electric field resist material used to form electric field resist layer 14 may include one or more solvents to facilitate application of electric field resist layer 14. Following application of electric field resist layer 14 upon layer 12, a heating step may be carried out in order to drive the solvents from electric field resist layer 14. Such "soft bake" heating steps are typically carried out to prevent the solvents from interfering with polymerization and to promote adhesion of electric field resist layer 14 to underlying layer 12.

Figure 3:
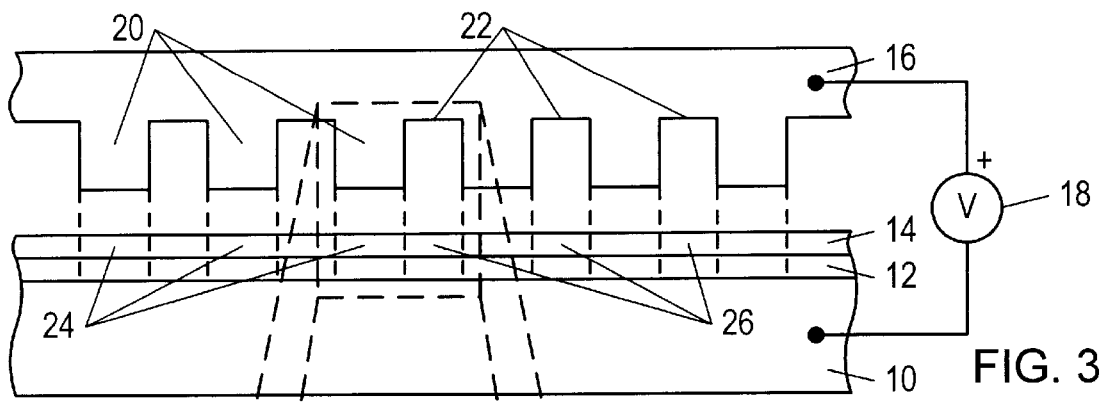
FIG. 3 is a partial cross-sectional view of the semiconductor substrate of FIG. 2, wherein the electric field resist layer is subjected to an electric field formed by the application of an electrical voltage between an electrically conductive plate and the semiconductor substrate in accordance with one embodiment of the present invention, and wherein the strength of the electric field is sufficient between raised portions of the conductive plate and the semiconductor substrate to: (i) cause polymerized molecules within the electric field resist layer to break apart (positive resist layer), or (ii) cause unpolymerized molecules within the electric field resist layer to polymerize (negative resist layer)

Following formation of electric field resist layer 14, portions of electric field resist layer 14 are exposed to an electric field of sufficient strength to cause polymerized molecules therein to break apart (positive resist layer) or unpolymerized molecules to polymerize (negative resist layer). FIG. 3 is a partial cross-sectional view of electric field resist layer 14 being subjected to an electric field formed by the application of an electrical voltage between an electrically conductive plate 16 and semiconductor substrate 10 in accordance with one embodiment of the present invention. A voltage source 18 is used to apply the electrical voltage between semiconductor substrate 10 and an electrically conductive plate 16.

Conductive plate 16 is preferably made of a metal, and preferably from aluminum. Alternately, conductive plate 16 may be made from, for example, copper, a copper alloy, nickel, or iron. Conductive plate 16 has opposed upper and lower surfaces, and during exposure of electric field resist layer 14, the lower surface of conductive plate 16 is positioned parallel to and in close proximity to the substantially flat upper surface of electric field resist layer 14. The lower surface of conductive plate 16 has several raised portions 20. Recessed portions 22 are formed between adjacent raised portions 20. During exposure of electric field resist layer 14, raised portions 20 extend downward toward the exposed upper surface of electric field resist layer 14 such that raised portions 20 are closer to the upper surface of electric field resist layer 14 than recessed portions 22. The strength of the electric field formed between conductive plate 16 and semiconductor substrate 10 is inversely proportional to the distance between conductive plate 16 and semiconductor substrate 10. As a result, the electric field is strongest in regions 24 of electric field resist layer 14 between raised portions 20 and semiconductor substrate 10, and weakest in regions 26 of electric field resist layer 14 between recessed portions 22 and semiconductor substrate 10. It is postulated that the electric field lines extend substantially directly between conductive plate 16 and semiconductor substrate 10 such that little if any stray or fringing electric fields occur.

Figure 4:
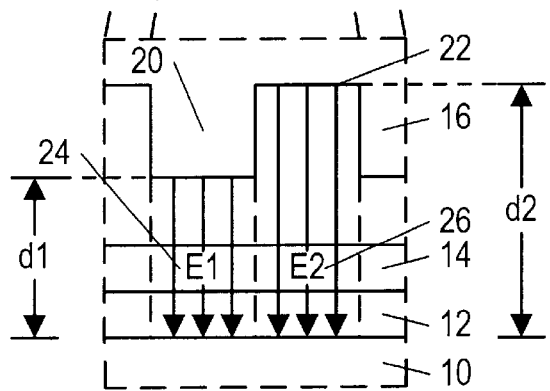
FIG. 4 is an exploded view of a region of FIG. 3 between a raised portion and a recessed portion of the conductive plate and the semiconductor substrate, wherein the electric field is strongest between the raised portion and the semiconductor substrate and weakest between the recessed portion and the semiconductor substrate.

FIG. 4 is an exploded view of a region of FIG. 3 between conductive plate 16 and semiconductor substrate 10 and including a raised portion 20 and a recessed portion 22. A distance d1 exists between raised portion 20 of conductive plate 16 and semiconductor substrate 10, and a distance d2 exists between recessed portion 22 of conductive plate 16 and semiconductor substrate 10, where d2>d1. The strength of the electric field between conductive plate 16 and semiconductor substrate 10 is E1 in region 24 of electric field resist layer 14 between raised portion 20 of conductive plate 16 and semiconductor substrate 10. The strength of the electric field is E2 in region 26 of electric field resist layer 14 between recessed portion 22 of conductive plate 16 and semiconductor substrate 10. As d2>d1 and the strength of the electric field is inversely proportional to the distance between conductive plate 16 and semiconductor substrate 10, E1>E2. As a result, portions of electric field resist layer 14 within regions 24 are subjected to a higher electric field strength than portions within regions 26. It is believed that the electric field lines extend between conductive plate 16 and semiconductor substrate 10 substantially perpendicular to the surface of electric field resist layer 14 as shown, and that few if any non-perpendicular electric field lines exist. This situation allows fine line resolution to be achieved.

Voltage source 18 preferably produces a direct current (d.c.) voltage having a constant magnitude during exposure of electric field resist layer 14. Alternately, voltage source 18 may produce an alternating current (a.c.) having a magnitude which varies with time. Voltage source 18 is operated to produce a voltage such that the strength of the electric field produced between conductive plate 16 and semiconductor substrate 10 is: (i) sufficient to cause polymerized molecules within regions 24 of electric field resist layer 14 to break apart (positive resist layer) or unpolymerized molecules to polymerize (negative resist layer), and (ii) insufficient to cause polymerized molecules within regions 26 of electric field resist layer 14 to break apart (positive resist layer) or unpolymerized molecules to polymerize (negative resist layer).

Figure 5:
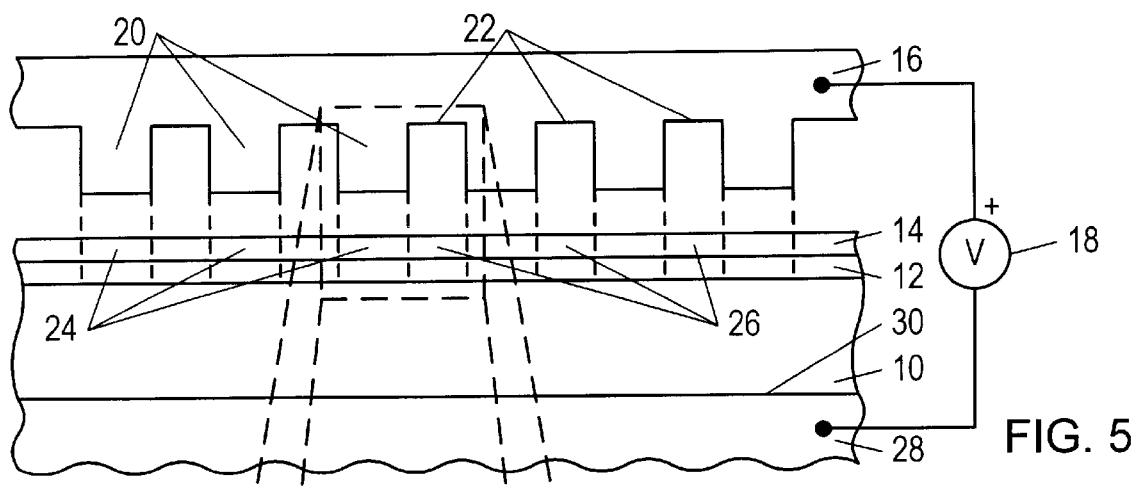
FIG. 5 is a partial cross-sectional view of the semiconductor substrate of FIG. 2, wherein the electric field resist layer is subjected to an electric field formed by the application of an electrical voltage between the electrically conductive plate of FIG. 3 proximate the upper topography of the semiconductor substrate and a second electrically conductive plate (e.g., a wafer chuck) contacting a backside surface of the semiconductor substrate in accordance with another embodiment of the present invention, and wherein the strength of the electric field passing through the electric field resist layer varies between raised and recessed portions of the first conductive plate.
Figure 6:
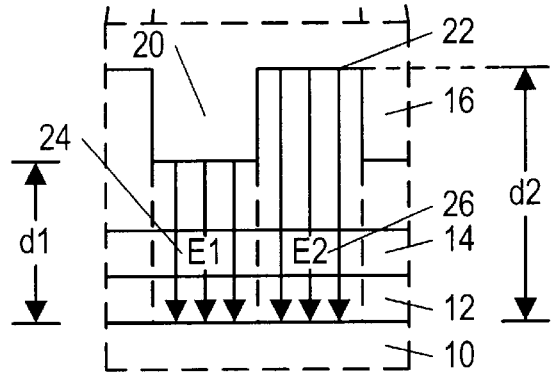
FIG. 6 is an exploded view of a region of FIG. 5 between a raised portion and a recessed portion of the conductive plate and the semiconductor substrate, wherein the electric field is strongest between the raised portion and the semiconductor substrate and weakest between the recessed portion and the semiconductor substrate.

FIG. 5 is a partial cross-sectional view of electric field resist layer 14 being subjected to an electric field formed by the application of an electrical voltage between electrically conductive plate 16 and a second electrically conductive plate 28 contacting a backside surface 30 of semiconductor substrate 10 in accordance with another embodiment of the present invention. Second electrically conductive plate 28 may be, for example, an electrically conductive wafer chuck. Voltage source 18 provides an electrical voltage between electrically conductive plate 16 and second electrically conductive plate 28. FIG. 6 is an exploded view of a region of FIG. 5 between a raised portion and a recessed portion of the conductive plate and semiconductor substrate 10. As before, the strength of electric field E1 between raised portion 20 of conductive plate 16 and semiconductor substrate 10 is greater than the strength of electric field E2 between recessed portion 22 of conductive plate 16 and semiconductor substrate 10.

Figure 7:
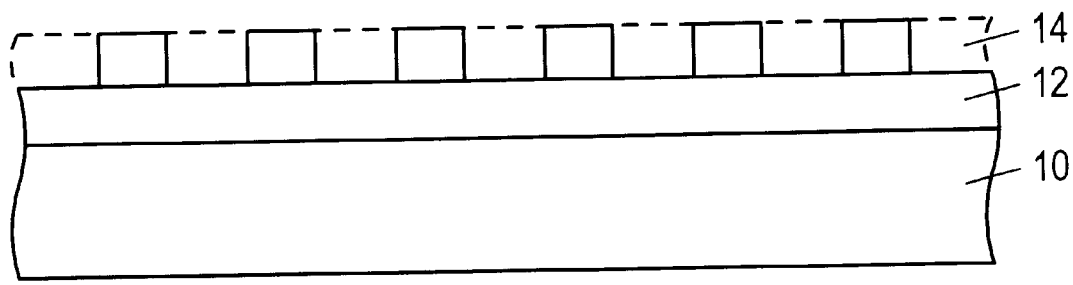
FIG. 7 is a partial cross-sectional view of the semiconductor substrate of FIG. 3 or FIG. 5 following a developing step, wherein unpolymerized portions of the electric field resist layer have been removed and only the polymerized portions remain.

Following the exposure step, electric field resist layer 14 is subjected to a developing step which removes the unpolymerized portions of electric field resist layer 14. The developing step may involve, for example, immersion of semiconductor substrate 10 in a liquid which dissolves the unpolymerized portions of electric field resist layer 14. Alternately, the developing step may involve the application of such a developing liquid to the exposed upper surface of electric field resist layer 14 (e.g., spray development or puddle development). FIG. 7 is a partial cross-sectional view of semiconductor substrate 10 following the developing step, wherein the unpolymerized portions of electric field resist layer 14 have been removed and only the polymerized portions remain. Following development, semiconductor substrate 10 may be rinsed to remove the remaining developing liquid.

If electric field resist layer 14 is being selectively polymerized, then the developer used to remove unpolymerized material may be somewhat similar to that used to conventionally remove unpolymerized resist used, for example, in a normal lithographic flow. The developer chosen is one that removes "non-hardened" material from layer 14, regardless of how the layer becomes selectively hardened.

Following the developing step, a second heating step may be carried out in order to remove remaining solvents from electric field resist layer 14. Such "hard bake" heating steps are typically carried out to further promote adhesion of electric field resist layer 14 to underlying layer 12.

Figure 8:
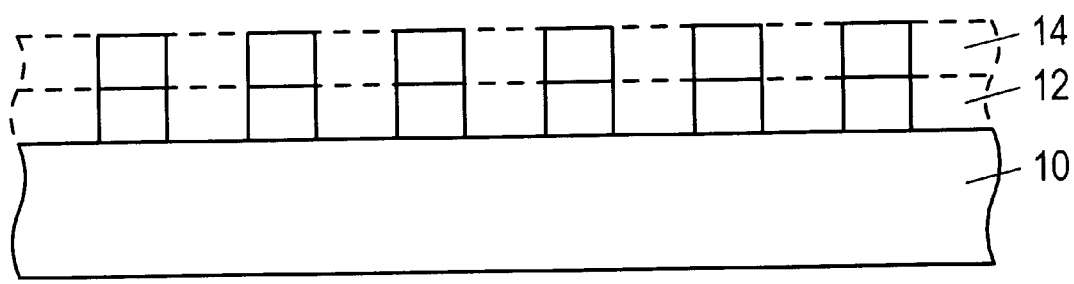
FIG. 8 is a partial cross-sectional view of the semiconductor substrate of FIG. 7 following an etching step, wherein only the remaining polymerized portions of the electric field resist layer and the underlying portions of the layer to be patterned remain upon the upper topography of the semiconductor substrate.

Following the developing step, the upper topography of semiconductor substrate 10 is subjected to an etchant during an etching step. The remaining polymerized portions of electric field resist layer 14 are resistant to the etchant and serve to protect the underlying portions of layer 12. The etching step may involve subjecting semiconductor substrate 10 to a liquid etchant (i.e., wet etching) or a dry chemical etchant (i.e., dry etching). The etchant removes portions of layer 12 not protected by the remaining polymerized portions of electric field resist layer 14. FIG. 8 is a partial cross-sectional view of semiconductor substrate 10 following the etching step, wherein only the remaining polymerized portions of electric field resist layer 14 and the underlying portions of layer 12 remain upon the upper topography of semiconductor substrate 10. Etchants are well known in the art. The etching step may employ any wet or dry etch composition suitably chosen to selectively remove the portions of layer 12 not covered by the remaining polymerized portions of electric field resist layer 14 without adversely affecting the portions of layer 12 protected by the overlying remaining polymerized portions of electric field resist layer 14.

Figure 9:
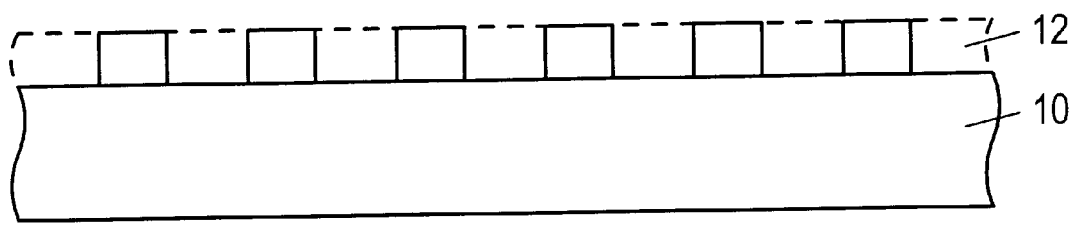
FIG. 9 is a partial cross-sectional view of the semiconductor substrate of FIG. 8 following a resist stripping step, wherein the remaining polymerized portions of the electric field resist layer have been removed and only the desired features formed from the layer to be patterned remain upon the upper topography of the semiconductor substrate.

Following the etching step, the remaining polymerized portions of electric field resist layer 14 are removed during a resist stripping step. During the resist stripping step, the remaining polymerized portions of electric field resist layer 14 may be dissolved using a liquid stripping agent (i.e., wet stripping) or oxidized in a chamber containing an oxygen-rich ambient (i.e., dry stripping). FIG. 9 is a partial cross-sectional view of semiconductor substrate 10 following the resist stripping step, wherein the remaining polymerized portions of electric field resist layer 14 have been removed and only the desired features formed from layer 12 remain upon the upper topography of semiconductor substrate 10.

Raised portions 20 and recessed portions 22 of conductive plate 16 may be patterned using, for example, x-ray lithography, electron beam lithography, or ion beam lithography, allowing the present invention and method to form features having physical dimensions smaller than those obtainable using photolithography.

Semiconductor substrate 10 is preferably a silicon wafer having several die areas defined on a substantially flat upper surface. Conductive plate 16 preferably includes sufficient numbers of raised portions 20 and recessed portions 22 to expose electric field resist layer 14 covering all die areas during a single exposure step. This allows for the highest possible production volume (i.e., throughput). Alternately, conductive plate 16 may include a sufficient number of raised portions 20 to expose a portion of electric field resist layer 14 covering a fraction of the die areas during a single exposure step, the process throughput increasing with the number of die areas simultaneously exposed.

Figure 10A:
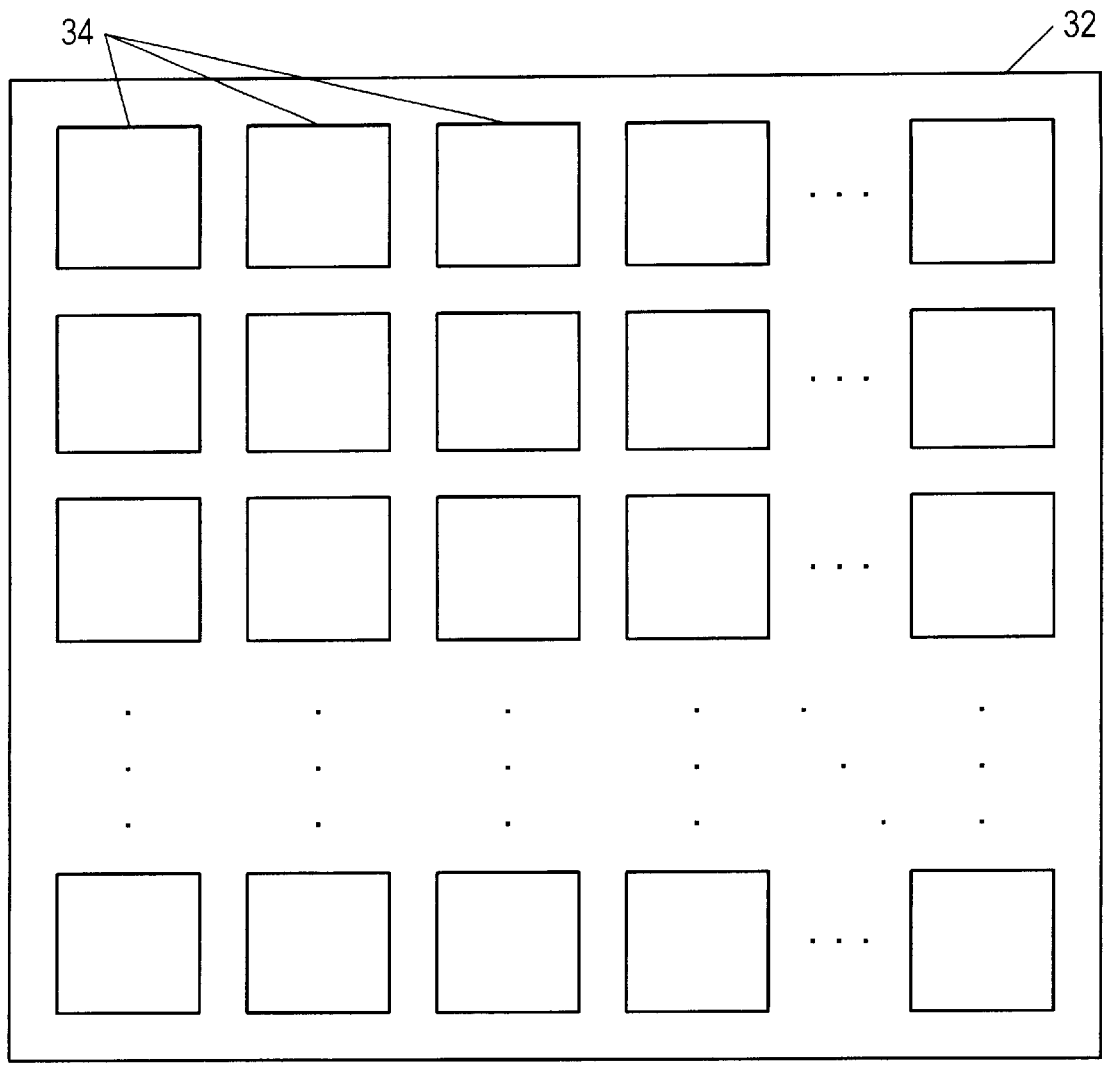
FIG. 10a is a bottom plan view of a plate having multiple electrically conductive structures arranged upon on a lower surface in accordance with another embodiment of the present invention.
Figure 10B:
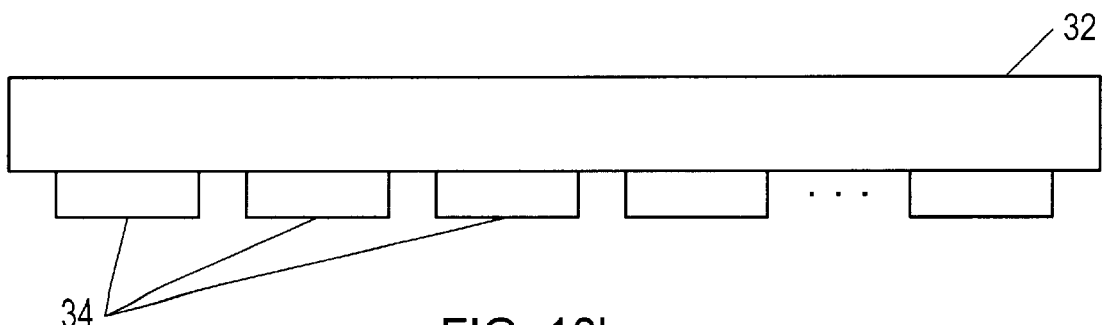

FIG. 10a is a bottom plan view of a plate 32 having multiple electrically conductive structures 34 arranged upon on a lower surface in accordance with another embodiment of the present invention. FIG. 10b is a side elevation view of plate 32. Plate 32 is preferably made of an electrical insulating material (e.g., plastic, fiberglass, etc.). Each electrically conducive structure 34 is preferably made of a metal, for example aluminum, copper, a copper alloy, nickel, or iron. Each electrically conductive structure 34 is electrically isolated from other electrically conductive structures and from plate 32, and may be selectively connected to a terminal of voltage source 18 through, for example, an electrical switch. Plate 32 may be used in place of electrically conductive plate 16 to expose a portion of electrical field resist layer 14. The dimensions of each electrically conductive structure 34 are preferably small compared to the dimensions of the smallest area of electric field resist layer 14 to be exposed (i.e., feature to be formed). By using multiple exposures, shifting the lateral position of plate 32 relative to an underlying semiconductor substrate between each exposure, and selectively connecting different electrically conductive structures 34 to a terminal of voltage source 18 (i.e., enabling different electrically conductive structures 34) during each exposure, plate 32 may be used to transfer a complex pattern to electric field resist layer 14.

During use, the lower surface of plate 32 is positioned parallel to and in close proximity to the substantially flat upper surface of electric field resist layer 14. Electrically conductive structures 34 on the lower surface of plate 32 extend downward toward the exposed upper surface of electric field resist layer 14. A portion of electrically conductive structures 34 are selectively connected to one terminal of voltage source 18, and the other terminal of voltage source 18 is connected to either semiconductor substrate 10 or electrically conductive plate 28 in contact with backside surface 30 of semiconductor substrate 10. Voltage source 18 is operated to produce a voltage such that the strength of the electric field produced between each member of the portion of electrically conductive structures 34 connected to a terminal of voltage source 18 and semiconductor substrate 10 is sufficient to cause polymerized molecules within regions of electric field resist layer 14 through which the electric fields pass to break apart (positive resist layer) or unpolymerized molecules to polymerize (negative resist layer.

Plate 32 is used to expose a portion of electric field resist layer 14 using multiple exposures. Between each exposure, plate 32 is shifted laterally relative semiconductor substrate 10 in order to expose new portions of electric field resist layer 14. During each exposure, different electrically conductive structures 34 are enabled. As a result, a complex pattern may be transferred to electric field resist layer 14.

Figure 11A:
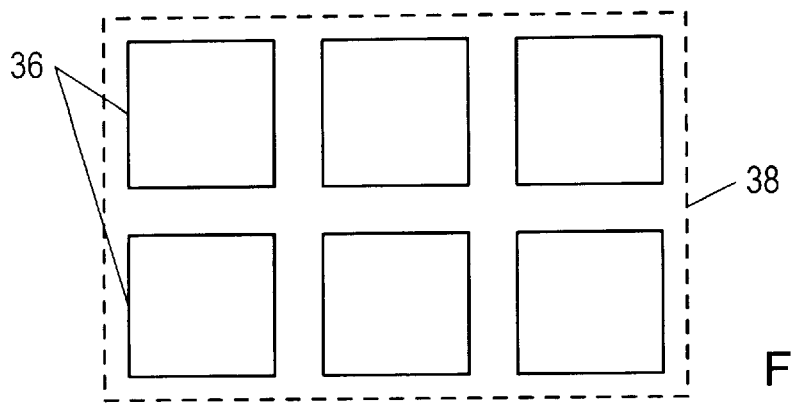
FIG. 11a is a top plan view of portions of an electric field resist layer exposed within a defined region of the electric filed resist layer during a first exposure using the plate of FIGS. 10a–b.
Figure 11B:
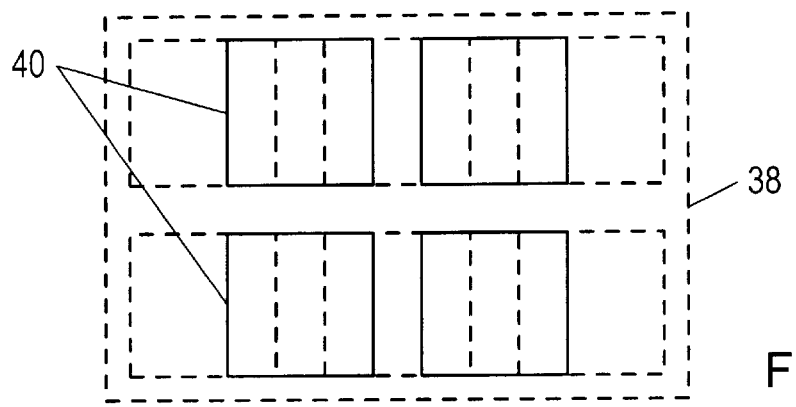
FIG. 11b is a top plan view of portions of the electric field resist layer exposed within the defined region of the electric filed resist layer of FIG. 11a during a second exposure using the plate of FIGS. 10a–b.
Figure 11C:
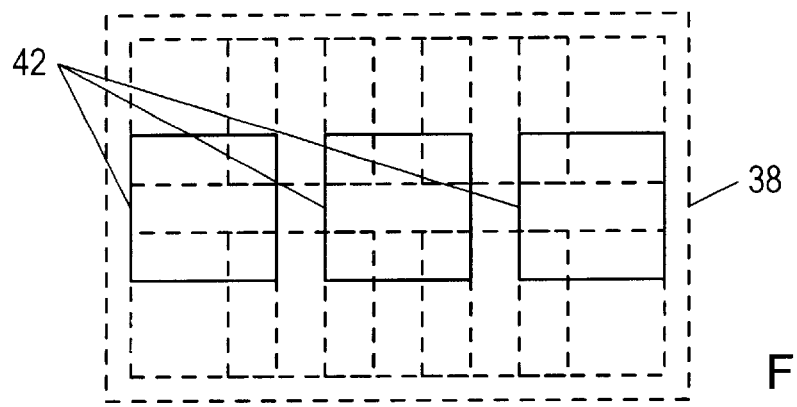
FIG. 11c is a top plan view of portions of the electric field resist layer exposed within the defined region of the electric filed resist layer of FIG. 11a during a third exposure using the plate of FIGS. 10a–b.
Figure 11D:
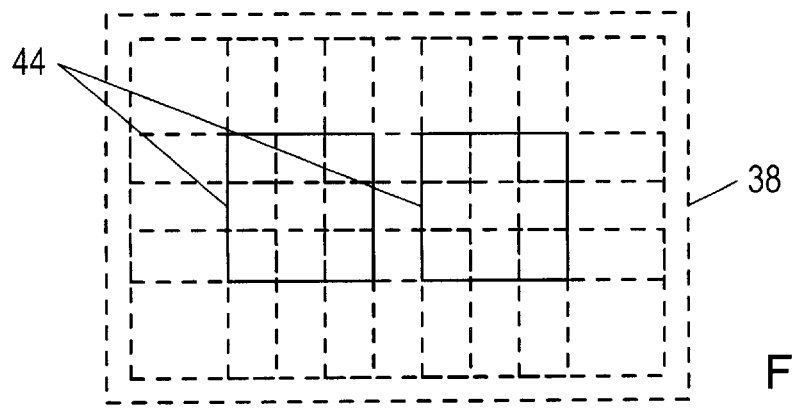
FIG. 11d is a top plan view of portions of the electric field resist layer exposed within the defined region of the electric filed resist layer of FIG. 11a during a fourth exposure using the plate of FIGS. 10a–b.

FIGS. 11a–d will now be used to illustrate the expose of a relatively large region of electric field resist layer 14 using plate 32 of FIGS. 10a–b and a sequence of four exposures. During each exposure, an electric field is created which passes through select portions of electric field resist layer 14. FIG. 11a is a top plan view of portions 36 exposed within a region 38 of electric filed resist layer 14 during a first exposure. If electric filed resist layer 14 is a positive resist, region 38 is a region in which resist is to be removed, exposing the underlying portion of layer 12. If, on the other hand, electric filed resist layer 14 is a negative resist, region 38 is a region in which resist is to remain, forming a protective layer over the underlying portion of layer 12. Following each exposure, plate 32 is shifted laterally with respect to semiconductor substrate 10. Subsequent exposed portions overlap previous exposed portions in order to ensure complete exposure of region 38. FIGS. 11b–d are top plan views of portions of portions 40, 42, and 44, respectively, exposed within region 38 of electric filed resist layer 14 during respective second, third, and fourth exposures. As a result of the four sequential exposures, region 38 of electric filed resist layer 14 is completely exposed.

In FIGS. 10a–b, electrically conductive structures 34 are rectangular in shape and arranged in a two-dimensional array upon the lower surface of plate 32. FIGS. 11a–d also reflect such a configuration. It is noted that electrically conductive structures 34 may have other shapes (e.g., square or other polygon), and may be arranged in any number of ways upon the lower surface of plate 32. It is also noted that the multiple exposures may be accomplished using two or more plates 32. For example, the first and second exposures of FIGS. 11a–b may be accomplished using a first plate 32, and the third and fourth exposures of FIGS. 11c–d may be accomplished using a second plate 32 having electrically conductive structures 34 arranged such that the exposure areas of the second plate 32 overlap the exposure areas of the first plate 32.

The use of plate 32 provides flexibility not possible with electrically conductive plate 16. In order to transfer a new pattern using an electrically conductive plate 16, a new electrically conductive plate 16 embodying the new pattern must be formed. On the other hand, when using plate 32, the new pattern may be transferred by simply changing the number of exposures, the amounts and directions plate 32 is shifted between exposures, and the electrically conductive structures 34 enabled during each exposure.

It will be appreciated by those skilled in the art having the benefit of this disclosure that this invention is believed to be a lithographic apparatus and method which uses an electric field to form features upon an upper topography of a semiconductor substrate. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. An apparatus for selectively exposing a semiconductor topography to an electric field, comprising:

an electrically conductive plate having opposed upper and lower surfaces, wherein the lower surface includes a plurality of raised portions interposed among a plurality of recessed portions; and a voltage source adapted to produce an electrical voltage between the electrically conductive plate and the semiconductor topography adapted for being brought proximate the plurality of raised and recessed portions such that the electric field is formed between the conductive plate and the semiconductor topography, when the topography is present.

2. The apparatus as recited in claim 1, wherein the lower surface of the conductive plate is adapted to be positioned above and in close proximity to the semiconductor topography.

3. The apparatus as recited in claim 1, wherein the electrically conductive plate comprises aluminum.

4. The apparatus as recited in claim 1, wherein the voltage source is adapted to produce an alternating current (a.c.) voltage.

5. The apparatus as recited in claim 1, wherein the voltage source is adapted to produce a direct current (d.c.) voltage.

6. An apparatus for selectively exposing a semiconductor topography to an electric field, comprising:

a first electrically conductive plate having opposed upper and lower surfaces, wherein the lower surface includes a plurality of raised portions interposed among a plurality of recessed portions;

a second electrically conductive plate having opposed upper and lower surfaces, wherein the upper surface is adapted to electrically couple with the semiconductor topography adapted to be placed upon the second electrically conductive plate;

a voltage source adapted to produce an electrical voltage between the first electrically conductive plate and the second electrically conductive plate; and wherein the semiconductor topography is adapted to be positioned proximate the plurality of raised and recessed portions of the first electrically conductive plate such that an electric field is formed between the first conductive plate and the semiconductor topography.

7. The apparatus as recited in claim 6, wherein the lower surface of the conductive plate is adapted to be positioned above and in close proximity to the semiconductor topography when present.

8. The apparatus as recited in claim 6, wherein the electrically conductive plate comprises aluminum.

9. The apparatus as recited in claim 6, wherein the voltage source is adapted to produce a direct current (d.c.) voltage.

10. The apparatus as recited in claim 6, wherein the voltage source is adapted to produce an alternating current (a.c.) voltage.

11. An apparatus for exposing a layer of a material formed upon a surface of a semiconductor substrate to an electric field, comprising:

a plate having opposed upper and lower surfaces and comprising a plurality of electrically conductive structures arranged upon the lower surface; and a voltage source for applying an electrical voltage between a portion of the plurality of the electrically conductive structures and the semiconductor substrate; and wherein the semiconductor substrate is adapted to be positioned proximate the plurality of electrically conductive structures such that: (i) an electric field is formed between the portion of the plurality of electrically conductive structures and the semiconductor substrate, and (ii) the layer is exposed to the electric field.

12. The apparatus as recited in claim 11, wherein the lower surface of the plate is positioned above and in close proximity to the surface of the semiconductor substrate when the semiconductor substrate is positioned proximate the electrically conductive structures.

13. The apparatus as recited in claim 11, wherein the plurality of electrically conductive structures are electrically isolated from the plate and from each other.

14. The apparatus as recited in claim 13, wherein each of the plurality of electrically conductive structures are adapted to be operably coupled to a terminal of the voltage source.

15. The apparatus as recited in claim 11, wherein the voltage source comprises two terminals, and wherein the semiconductor substrate is adapted to be coupled to one terminal, and wherein each of the portion of the plurality of electrically conductive structures is operably coupled to the other terminal.

16. The apparatus as recited in claim 11, wherein the voltage source is adapted to produce a direct current (d.c.) voltage.

17. The apparatus as recited in claim 11, wherein the voltage source is adapted to produce an alternating current (a.c.) voltage.

* * * * *